(12) United States Patent
Jahanghir

(10) Patent No.: US 9,577,668 B2
(45) Date of Patent: *Feb. 21, 2017

(54) SYSTEMS AND APPARATUSES FOR PERFORMING CABAC PARALLEL ENCODING AND DECODING

(71) Applicant: Intel Corporation, Santa Clara, CA (US)

(72) Inventor: Musa Jahanghir, Palo Alto, CA (US)

(73) Assignee: Intel Corporation, Santa Clara, CA (US)

(*) Notice: Subject to any disclaimer, the term of this patent is extended or adjusted under 35 U.S.C. 154(b) by 9 days.

This patent is subject to a terminal disclaimer.

(21) Appl. No.: 14/014,886

(22) Filed: Aug. 30, 2013

(65) Prior Publication Data
US 2014/0169445 A1 Jun. 19, 2014

Related U.S. Application Data

(63) Continuation of application No. 12/006,129, filed on Dec. 31, 2007, now Pat. No. 8,542,727.

(51) Int. Cl.
H04B 1/66 (2006.01)
H03M 7/40 (2006.01)
H04N 19/61 (2014.01)
H04N 19/436 (2014.01)
H04N 19/93 (2014.01)
H04N 19/91 (2014.01)

(52) U.S. Cl.
CPC ......... *H03M 7/4006* (2013.01); *H04N 19/436* (2014.11); *H04N 19/61* (2014.11); *H04N 19/93* (2014.11); *H04N 19/91* (2014.11)

(58) Field of Classification Search
CPC ...................................................... H04M 11/06
USPC ................................ 375/222, 240, 230, 232
See application file for complete search history.

(56) References Cited

U.S. PATENT DOCUMENTS

| 4,975,864 | A | 12/1990 | Sendall et al. |
| 5,583,500 | A | 12/1996 | Allen et al. |
| 7,423,562 | B2 * | 9/2008 | Kim et al. ................ 341/67 |
| 7,535,387 | B1 * | 5/2009 | Delva .............. H03M 7/4006 341/107 |
| 2005/0012648 | A1 * | 1/2005 | Marpe et al. ............ 341/107 |

(Continued)

Primary Examiner — Samina Choudhry
(74) Attorney, Agent, or Firm — Schulbert Law Group PLLC

(57) ABSTRACT

Apparatuses, systems, and computer program products that encode and/or decode information of a video stream, such as an MPEG-4 video stream, are disclosed. Some embodiments comprise an apparatus having a binarizer module to create a plurality of bins for a syntax element for information of the video stream, a context selection module to generate an index value and a most probable symbol (MPS) value for encoding the plurality of bins, and an arithmetic coding module to encode a first and a second bin of the plurality of bins based on a first probability value and a second probability value, respectively, wherein the first and second probability values are determined via the generated index value and MPS value. Examples of some embodiments are high definition personal video recorders, transcoders, computers, personal digital assistants, cellular telephones, portable video players, high definition digital versatile disc (HD-DVD) devices, and Blu-ray disc-read only memory (BD-ROM) devices.

15 Claims, 6 Drawing Sheets

(56) References Cited

U.S. PATENT DOCUMENTS

| | | |
|---|---|---|
| 2005/0074176 A1 | 4/2005 | Marpe et al. |
| 2005/0259946 A1* | 11/2005 | Kitamura .......................... 386/46 |
| 2006/0023795 A1* | 2/2006 | Kim .............................. 375/242 |
| 2006/0294174 A1 | 12/2006 | Haque et al. |
| 2007/0080832 A1* | 4/2007 | Yang et al. ..................... 341/50 |
| 2008/0120676 A1 | 5/2008 | Morad et al. |
| 2008/0240233 A1 | 10/2008 | Au et al. |
| 2009/0100251 A1* | 4/2009 | Hsu et al. ..................... 712/221 |

\* cited by examiner

SYSTEMS AND APPARATUSES FOR PERFORMING CABAC PARALLEL ENCODING AND DECODING

FIELD

The embodiments herein generally relate to the field of information coding and decoding. More particularly, the embodiments relate to systems and apparatuses for performing encoding and/or decoding operations of context-based adaptive binary arithmetic coding (CABAC) in parallel.

BACKGROUND

Context-Based Adaptive Binary Arithmetic Coding (CABAC) is an entropy coding method of a relatively new industry standard for coding and compressing audio and video (AV) information, commonly referred to as H.264/AVC or simply as H.264. The H.264 data compression-coding standard, sometimes loosely referred to as MPEG-4 (moving pictures expert group), represents a new generation of compression-coding that is becoming well known in the art. People expect the H.264 standard to supersede the widely used MPEG-2 standard for many applications. H.264 generally achieves higher compression ratios than MPEG-2. Unfortunately, H.264 achieves the higher compression ratios at the expense of increased processing complexity.

In some aspects, H.264 is similar to MPEG-2. For example, both MPEG-2 and MPEG-4 utilize motion compensation to match current pixel blocks with reference pixel blocks to minimize the differential data that is to be transform-encoded. One compression encoding option of H.264 uses CABAC (context-based adaptive binary arithmetic coding) for syntax elements produced by transform-encoding (including motion vector information and other related data). CABAC potentially offers substantial additional compression efficiency relative to other types of later-stage encoding, but is considerably more complex than previous AV encoding and/or decoding standards thus far. To date, people have simulated or modeled CABAC encoders and/or decoders for H.264 using hardware and software. Unfortunately, the performance results of these models have generally been poor, especially the encoding/decoding throughputs of high resolution signals, high bit rate, and real-time video signals, such as those for high definition television (HDTV). Additionally, CABAC encoding/decoding of binary strings, or bins, in previous CABAC encoders/decoders has generally occurred in a serial fashion. In other words, for two bins, one bin must generally be decoded before the second bin may be decoded. This serial requirement of bins usually creates bottlenecks in systems and apparatuses that degrade or impact overall performance and consume additional power.

BRIEF DESCRIPTION OF THE DRAWINGS

Aspects of the embodiments will become apparent upon reading the following detailed description and upon reference to the accompanying drawings in which like references may indicate similar elements.

DETAILED DESCRIPTION OF EMBODIMENTS

Figure 1A:
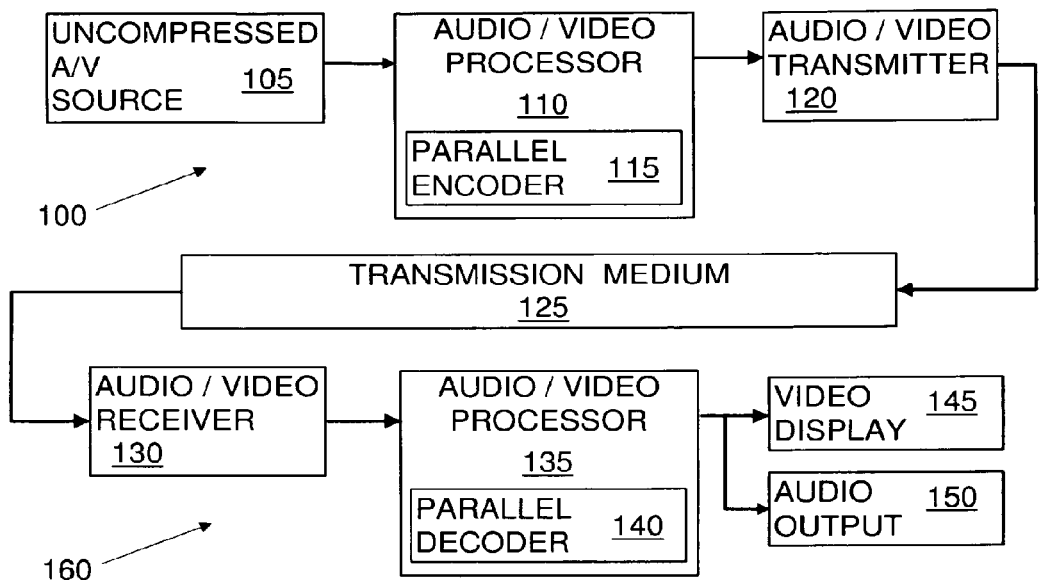
FIG. 1A depicts a block diagram of a system having two subsystems that may encode and decode video information.

The following is a detailed description of example embodiments depicted in the accompanying drawings. The example embodiments are in such detail as to clearly communicate aspects of the embodiments. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Apparatuses, systems, and computer program products that encode and/or decode information of a video stream are contemplated. Some embodiments comprise an apparatus having a binarizer module to create a plurality of bins for a syntax element for information of the video stream, a context selection module to generate an index value and a most probable symbol (MPS) value for encoding the plurality of bins, and an arithmetic coding module to encode a first and a second bin of the plurality of bins based on a first probability value and a second probability value, respectively, wherein the first and second probability values are determined via the generated index value and MPS value. In some embodiments, the apparatus may decode the plurality of bins via selections of probability values based on the index values and the MPS value. In numerous embodiments, the binarizer module may create at least one bin of the plurality of bins via an exponential Golomb code (EGC).

In several embodiments, the binarizer module may create a plurality of variable-length coded (VLC) bins for the syntax element. In at least one embodiment, the context module may have one or more look-up tables to generate the index value and the MPS value. In various embodiments, the arithmetic coding module may have a number of arithmetic coding engines, with one engine to process one bin while a second engine processes a second bin. In at least one embodiment, the arithmetic coding module has fifteen look-up tables to generate most probable symbol values and least probable symbol values to encode the four bins in a parallel fashion. In further embodiments, the arithmetic coding module may update offset and range values upon encoding the plurality of bins, wherein the updated offset and range values are to be used to encode a subsequent plurality of bins.

Some embodiments comprise a system, having a source of uncompressed video information and a processor to encode the uncompressed video information via a parallel encoder, wherein the parallel encoder comprises an arithmetic coding module to encode a plurality of bins based on probability values determined via an index value and a most probable symbol (MPS) value. Some embodiments also include a transmitter to transmit the encoded plurality of bins, such as a networking communication card, a high definition television transmitter, or an uplink communications system for sending digital video broadcasting to a satellite. In various embodiments, the video source may be such devices as a video camera, a hard drive of a computer, or a digital versatile disc (DVD). In many embodiments, the processor may decode compressed video information as well as encode uncompressed video information. Examples of some embodiments are a high definition personal video recorder (PVR), a transcoder, a laptop computer, a desktop computer, a personal digital assistant (PDA), a cellular telephone, a portable video player, a high definition digital versatile disc (HD-DVD) device, and a Blu-ray disc-read only memory (BD-ROM) device.

Further embodiments comprise a computer program product comprising a computer usable medium having computer usable program code for encoding video information. In such embodiments, the computer program product may include computer usable program code for selecting a plurality of bins for a syntax element of the video information, selecting a probability symbol value and a probability index value, and encoding the plurality of bins in parallel, wherein the encoding of the plurality of bins is via selection of a plurality of probability values corresponded to the plurality of bins, wherein further selection of each probability value is via the probability symbol value and the probability index value.

Numerous embodiments include computer usable program code for receiving an instruction to select the plurality of bins, the probability symbol, and the probability index value. Other embodiments also include computer usable program code for updating a range value and updating an offset value, wherein the range value and offset value are used in conjunction with the probability symbol value to select the plurality of probability values. Even further embodiments include computer usable program code for scaling and normalizing the range and offset values to generate the updated range value and the updated offset value.

In some embodiments, the computer usable program code for creates a plurality of variable-length coded bins using an exponential Golomb code (EGC), a unary code, or a variation of one of these. In at least one embodiment, the computer usable program code may select probability values from sixty-three (63) look-up tables, where the 63 tables correspond to six stages of encoding to process six bins in a single encoding iteration. In numerous embodiments, the computer usable program code for encoding the plurality of bins in parallel comprises code for detecting underflow and overflow conditions to determine a propagate condition and increment an outstanding bit count.

In the following discussions, the embodiments may describe processing video data or information. However, various embodiments may often process audio information in addition to video information. For example, an embodiment may encode video information of a movie, as well as encode the audio information of the movie that is associated with the video information. In other words, one or more embodiments may encode both the video and audio information of the movie, even though the discussion of the embodiment may only describe processing video information in an example.

Additionally, many of the examples, diagrams, and related discussion focus on building a parallel encoder. However, it should be noted that one or more of the embodiments disclosed herein may be modified to perform parallel decoding as well. For example, instead of a binarizer receiving a syntax element for a section of video information and producing a plurality of bins for parallel encoding of the bins, the embodiment may be modified or changed to accept a plurality of bins from parallel decoding, wherein the binarizer may use those bins to generate and decoded video stream. In other words, the embodiments herein teach both parallel encoding and parallel decoding.

Turning now to the drawings, FIG. 1A is a block diagram showing a system having two subsystems that may encode and decode video information according to some embodiments. First subsystem 100 comprises an uncompressed audio-video (A/V) source 105, an A/V processor 110, and an A/V transmitter 120. Depending on the embodiment, A/V source 105 may comprise one or more of a variety of different sources of audio and video information. For example, in one embodiment A/V source 105 may comprise a camera with a microphone, capturing and transferring audio and video information in an analog format such as by way of a national television system committee (NTSC) or phase alternating line (PAL) signal. In another embodiment, A/V source 105 may comprise a file stored on a video tape or other mass storage device and/or medium, such as on a hard drive of a computer, on a rewritable compact disc (CD), on a digital versatile disc (DVD), or on another type of device such as a flash memory device. Such file may be stored in a variety of different formats, such as in an audio video interleave (AV1) format or in an MPEG-1 or MPEG-2 format, as examples. In other words, "uncompressed" may refer to an A/V source 105 that has not been compressed using an MPEG-4 encoder or an H.264/CABAC encoder, and be either in an analog or a digital format.

A/V source 105 may transfer audio and video information to A/V processor 110, which may have a parallel encoder 115 which processes or encodes the information in a parallel fashion. A/V transmitter 120 may transfer the A/V stream generated by A/V processor 110 through a transport stream or transmission medium 125. For example, A/V transmitter 120 may comprise a networking communication card of a computer that transfers the encoded information over the Internet. As another example, A/V transmitter 120 may comprise an HDTV transmitter of a television station that broadcasts the encoded information over-the-air or via a satellite such as part of an uplink communications system transmitting a digital video broadcasting (DVB) stream to a satellite.

The system may also include an A/V receiver 130 that comprises a video signal source for a second subsystem 160. In other words, A/V receiver 130 may comprise a receiving circuit that receives a compression-encoded video signal from transmission medium 125 which may comprise, e.g., an over-the-air broadcast or a cable television transmission. In addition or alternatively, A/V receiver 130 may reproduce a video signal from a recording or storage medium such as a hard drive or a video tape storage medium. The video signal produced by A/V receiver 130 may have been compression-encoded in accordance with the well-known H.264 standard and CABAC (context-based adaptive binary arithmetic coding) may have been used as part of the compression encoding process that produced the compression-encoded video signal.

Subsystem 160 also includes an A/V processor 135 coupled to A/V receiver 130. For example, A/V processor 135 may be part of a computer, a television, a cellular telephone, a portable multimedia player, or other device capable of decoding and displaying one or more types of encoded video streams. A/V processor 135 may apply various processes to the compression-encoded video signal provided by A/V receiver 130 to allow the video signal to be displayed on a video display 145, as well as allow the associated audio to be heard from an audio output module 150. Continuing with one of the previous examples, video display 145 may comprise a flat panel computer display for displaying the video signal after it has been decoded and possibly subjected to other processing by A/V processor 135.

As illustrated in FIG. 1A, a component of A/V processor 135 may comprise parallel decoder 140 which may reverse the compression-encoding that was applied to the video signal. Parallel decoder 140 may be suitable for decoding a plurality of bins of an H.264/CABAC-encoded video signal in a substantially parallel manner and may have other capabilities as well. Aspects of parallel decoder 140, as well as parallel encoder 115, will be discussed in greater detail later.

While one embodiment of a system may include both a parallel encoder and a parallel decoder, such as parallel encoder 115 and parallel decoder 160 of subsystems 100 and 160, other systems may include varying numbers of each component and may not necessarily include both an encoder and a decoder. For example, one embodiment may include only a parallel decoding system, but no parallel encoder. As a more detailed example, A/V processor 135 may comprise an application specific integrated circuit (ASIC) chip of a high definition personal video recorder (PVR) in one embodiment of a system. Alternatively, another embodiment may comprise four parallel encoders 115, all four operating in parallel to simultaneously encode four different video streams. For example, the four parallel encoders may comprise part of a professional video encoding and uplink unit for a satellite broadcasting system. In other words, FIG. 1A illustrates only a few examples of how various systems may employ parallel encoders and/or parallel decoders, either individually or in combination.

Figure 1B:
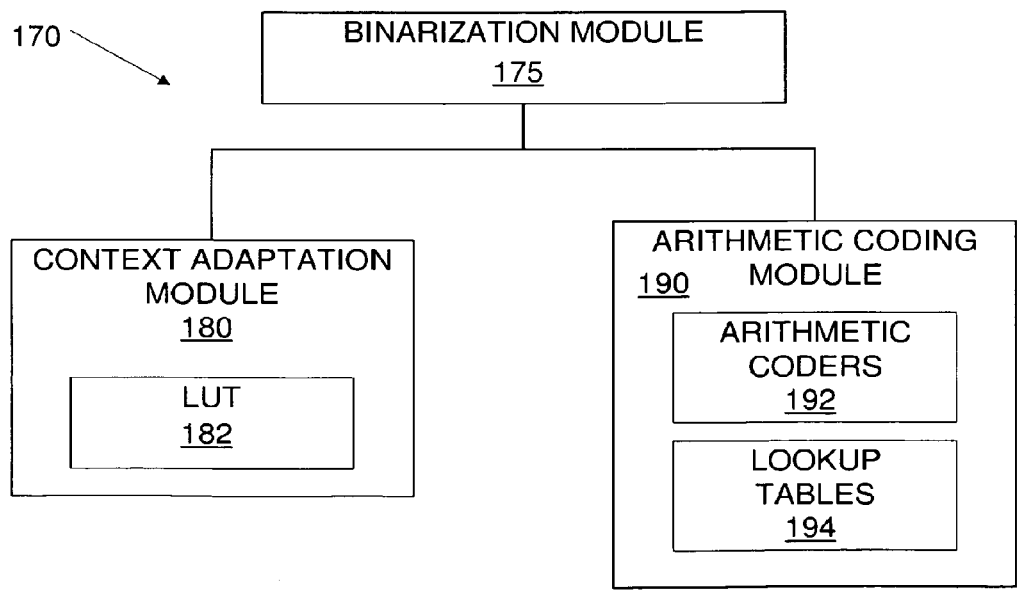
FIG. 1B depicts an apparatus that may process syntax elements of a stream of video information, in a parallel fashion, as part of an encoding and/or decoding operation.

To illustrate how various processes of encoding and/or decoding an H.264/CABAC stream may be performed in parallel, we turn now to FIG. 1B. A CABAC encoder/decoder (Codec) apparatus 170 that may process an H.264/CABAC stream in one or more embodiments is depicted in FIG. 1B, having a binarization module 175, a context adaptation (CA) module 180, and an arithmetic coding (AC) module 190. For example, apparatus 170 may comprise software and/or hardware that may encode and/or decode H.264/CABAC information for numerous types of devices. Examples of the types of devices that may employ an apparatus like apparatus 170 are transcoders, high definition televisions, H.264 high definition encoders or decoders, video recorders, laptops, desktop computers, personal digital assistants (PDAs), cellular telephones, portable video players, set-top-boxes, digital television (DTV), high definition digital versatile disc (HD-DVD) devices, and Blu-ray disc-read only memory (BD-ROM) devices, to name just a few. One benefit that apparatus 170 may provide is a reduced system demand for encoding or decoding video information, such that power consumption by the system is reduced. In other words, apparatus 170 may allow a system to encode or decode video information in a manner that consumes less power than previous methods, systems, and apparatuses.

A process of encoding or decoding an H.264/CABAC stream may begin with apparatus 170 issuing an encode/decode instruction or command to CA module 180 and binarization module 175 simultaneously. Based on the instruction or command, binarization module 175 may start the binarization operations on the stream. When operating as an encoder, binarization module 175 may create variable-length coded (VLC) bins according to a syntax element (SE). For example, in one embodiment such VLC bins may be either stored in a local buffer, such as random access memory (RAM), or be used in the next computational loop with non-regular structures for each code-word due to its length. To allow for parallel encoding and/or decoding in various embodiments, the embodiments may employ a more structured form for output of binarization module 175, where each a codeword may be split into a number, such as four, code-segments. When split into a number of code segments, each segment may be stored into an n-bin field of a local buffer, such as random access memory (RAM) entry, or each segment may be generated on the fly. Such code-word entry or signal may have information about the length of actual code-segments (<=n). If stored in the buffer, this information may be kept in the n-bin fields of the code-entry, and may include a relative address for the SE.

The VLC bins created by binarization module 175 may become inputs to computation loops of the CA module 180 and AC module 190. In some embodiments, the context adaptation may process the bins in a serial fashion. In other words, CA module 180 may process a series of bins one at a time, bin-by-bin, such that there is time-dependency involved. However, in other embodiments, CA module 180 may process a series of bins in a parallel fashion. For example, the processing path of CA module 180 may process a number of bins at a time, such as four bins at a time, in a simultaneous manner using one or more inputs from a "look-ahead" or "look-up" table (LUT) 182. Processing the series of bins in a parallel fashion may enable faster execution by CA module 180, faster than processing the series of bins in a bit-serial mode. CA module 180, which may be probability-table or picture-based, may convert between bins and (fractional) bits with a bin-to-bit ratio of greater than one.

Once binarizer module 175 encodes the symbols or values of syntax elements as a VLC, such as by an exponential Golomb code (EGC), a unary code, or a variation of such codes, binarizer module 175 may issue an instruction for CABAC encoding to arithmetic coding (AC) module 190. This instruction may include various types of information, such as a starting address called a context offset, a context category number, and context incrementing information. For syntax elements with several bins, AC module 190 may encode multiple bins during a single clock cycle using a plurality of arithmetic coders 192 and a plurality of lookup tables 194. For syntax elements with fewer bins, multiple syntax elements may be encoded each clock cycle. Performing arithmetic coding functions in a parallel fashion, on multiple bins or on multiple syntax elements, may be considered parallel arithmetic coding.

As noted, apparatus 170 may encode and/or decode an H.264/CABAC stream. Depending on the operation being performed, CA module 180 may perform the tasks of context initialization, context index derivation, and context updating. Using probability table-based binary arithmetic encoding/decoding, CA module 180 may convert either input bins into bits (fractional) or input bits (fractional) into bins. For example, during a decode operation CA module 180 may convert input bits (fractional) into bins. Binarization module 175 may perform binarization or debinarization, depending on the operation being performed, of each syntax element by an EGC decoder or by using a multi-symbol fast compact decoder (FCD) for VLC-type code-word matching.

Figure 2:
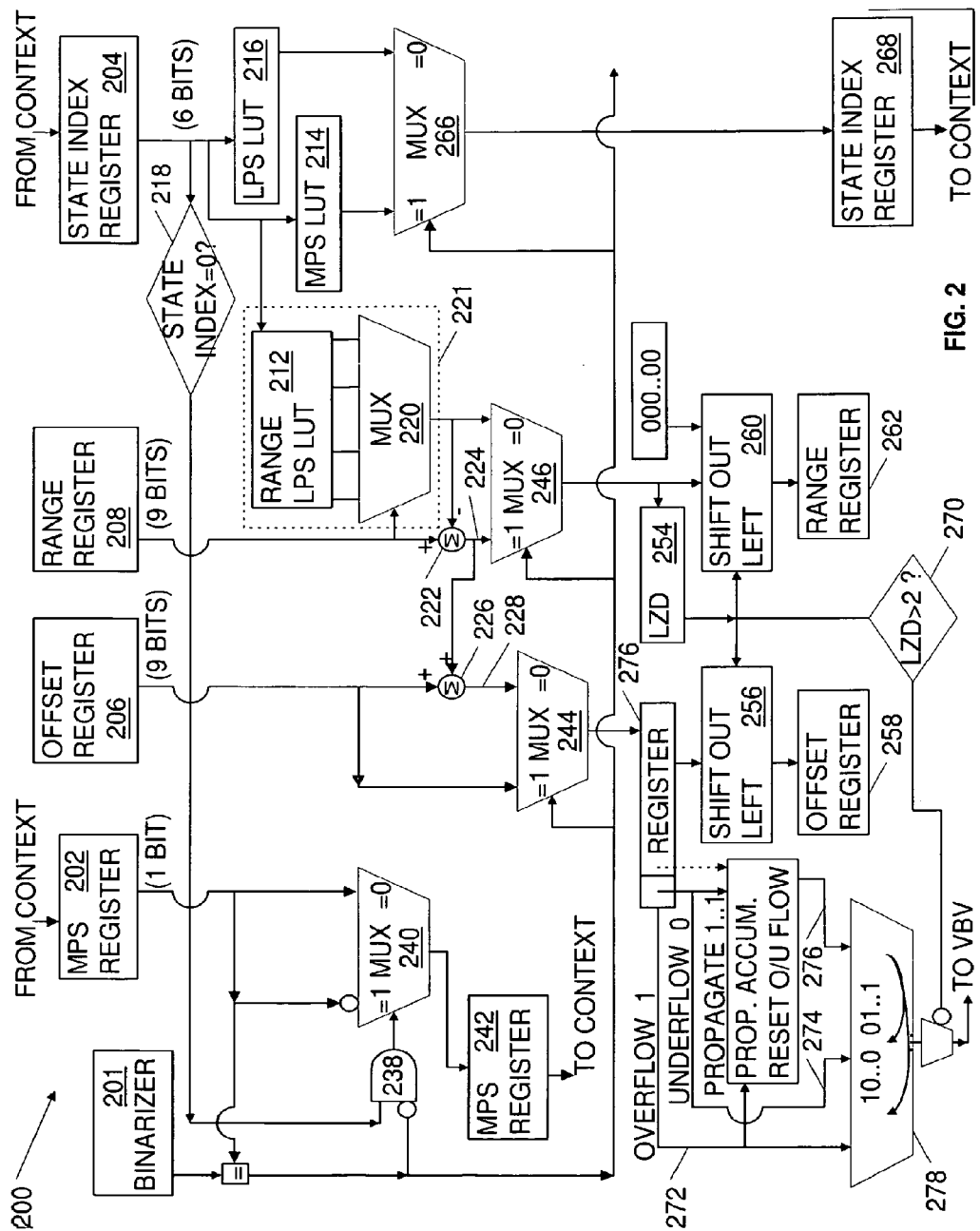
FIG. 2 shows a binary arithmetic encoder that may be employed in one or more embodiments to encode multiple bins during a single clock cycle.

To illustrate in more detail how one or more embodiments of an arithmetic coding module may encode multiple bins during a single clock cycle, we move now to FIG. 2. FIG. 2 depicts one embodiment of an arithmetic coding (AC) module 200. For example, AC module 200 may comprise one arithmetic engine in the plurality of arithmetic coders 192 shown in arithmetic coding module 190 of apparatus 170 shown in FIG. 1B.

According to the CABAC-encoding described by the 1-1.264 standard, there may be a total of 460 separate context models for the various syntax elements. Each "slice" of a video signal may contain different types of syntax elements. For each syntax element within a slice, there may be up to N bins ($b_1, b_2, \ldots, b_N$) based on the type of binarization to be performed. There may be one or more context labels associated with each of the bins. If there is more than one context label associated with a bin, then there are specific rules to select the appropriate context to use. Each of these context labels represent an aggregate of information associated with each bin.

In one or more embodiments, a context module may provide a probability model for one or more bins of a binarized symbol (syntax element). The context model may be chosen from a selection of available models depending on the statistics of recently encoded syntax elements. The context module may store the probability of each symbol being "1" or "0". For example, the context module of an embodiment may have numerous context states that may be used in connection with a parallel CABAC-encoding operation performed by AC module 200. Generally, a context can be defined as an aggregate amount of information that can be associated with an index number. For ease of explanation, in reference to parallel CABAC-encode operation, each context is related to a probability state index number, such as 0-7 (such that there are eight contexts in this example). In other embodiments, however, varying numbers of probability states may be used. Each probability state index number corresponds to a "context" that represents the purported odds that a predicted symbol value is incorrect when the predicted symbol value is compared to an actual symbol value.

For example, a context module may determine that a most probable symbol (MPS; sometimes alternatively referred to as a more probable symbol, a more or most likely symbol—MLS—or a more or most probable symbol—MPS) value at time "n" is a "1" (i.e., the bin value is more likely to be a "1"). This value may be brought into AC module 200 via an MPS register 202. The $MPS_n$ also has an associated probability state. The $MPS_n$ has a corresponding $LPS_n$ which in binary arithmetic is the inverse of the $MPS_n$. (LPS refers to "least probable symbol", which may also be referred to as the less likely symbol—LLS, or for present purposes the less or least probable bin—LPB or the less or least likely bin—LLB.) The $LPS_n$ also has an associated probability state, which is the compliment of the $MPS_n$ probability state. The $LPS_n$ probability state gives a percentage chance that the $MPS_n$ value is incorrect.

Entries for context models may be stored in a look-up table, such as LUT 182 that is part of context adaptation module 180 for apparatus 170 shown in FIG. 1. Each entry may include a 6-bit probability state index, which may be brought into state index register 204, and the binary (one bit) value of the most probable symbol value, introduced via MPS register 202. These seven bits together define a context index to be provided to the AC module 200. Although some embodiments may have eight 8 probability states as described earlier, other embodiments may instead have 64 or 128 probability states, as examples, each state with its own LPS probability (and therefore, an implicit MPS probability).

AC module 200 may receive a single bit to be encoded from the binerization module (element 201). When AC module 200 determines whether the MPS value is indeed the actual value to be encoded or decoded, a transition may be made to a next probability state based upon this determination. For instance, when in one probability state, there may be a 20% chance that the predicted MPS is wrong (i.e., there is a 20% probability that the LPS value is the correct value). If the MPS is predicted accurately (i.e., the MPS value is compared against an actual symbol value and the two are equal), the probability state transitions to the most probable state. For example, newly transitioned probability state may purport to have a 90% chance of predicting its own corresponding $MPS_n$, i.e., the next symbol or bin value to be encoded or decoded. This can represent an increased confidence in predicting the next bin value ($MPS_{n+1}$). For example, the newly transitioned probability state may purport to have a 10% chance of $LPS_{n+1}$ corresponding bin value when compared to the 90% chance of the new $MPS_n$.

However, if the MPS is predicted inaccurately, (i.e., the MPS value is compared against an actual symbol value and the two are not equal), the probability state may transition to the least probable state purporting to have a 70% chance of predicting its own corresponding MPS. For example, there may be a 30% chance of LPS for the n+1 corresponding symbol value. This can represent a decreased confidence in predicting the next value ($MPS_{n+1}$). The context module may operate in this fashion, selecting between the most probable state and least probable state whenever the value of MPS register 202 matches or does not match, respectively, the bit value to be encoded (element 201).

The context models may be initialized at the beginning of each slice and also at the beginning of each frame. The seven bit index entries of context states, at state index register 204 and MPS register 202, may be calculated by context adaptation module at the start of the slice and stored in a local memory to constitute the look-up table, such as LUT 182 shown in FIG. 1B. Upon receiving the value at MPS register 202 for the most probable symbol value from a look-up table of the context module, AC module 200 stores the most probable symbol value, which has use in arithmetic coding as will be detailed below. The AC module 200 also receives the current 6-bit probability state index value, which may be sent from the look-up table of the context module, and stores the value via state index register 204. In other words, state index register 204 may contain the index state ($\alpha$ probability), that an associated context purports to give the odds that the MPS in register 202 is incorrect, and therefore implicitly, that this value is correct.

The AC module 200 further includes an offset register 206 and a range register 208. The offset register 206 may store a current offset value and the range register 208 may store a current range value. As will be illustrated, the values stored in the offset register 206 and in the range register 208 may be updated from a previous cycle of operation of the AC module 200. The offset value may be derived from comparisons made between the bit being encoded (element 201) and the value of the MPS register 202, while the range value may be derived from a value that is output from a probability look-up table (LUT) 212, which may 64×4×8 bits as an example, which is in turn indexed by the state index value stored in the state index register 204, as will be detailed below.

Offset register 206 and range register 208 are used in arithmetic coding. As described previously, during the arithmetic coding process, the AC module 200 determines a likelihood, or probability, of correctly predicting a given value of MPS register 202. In some embodiments, in AC module 200, an offset is used, which may start at 0 for an encoding process. In arithmetic coding, this offset is referred to as a "tag" value. In AC module 200, if the actual value to be encoded is indeed the MPS (determined by comparing the value of the MPS register 202 to the actual value to be encoded), a number that is a function of the probability and the range in range register 208 is added to the offset, as will be described below. In AC module 200, if the actual bit to be encoded is actually the LPS (after comparing the MPS to the value to be decoded), the offset number in offset register 206 is not changed, but the range in range register 208 is reduced as a function of the LPS and the range in range register 208, in a manner described below.

In some embodiments, if the actual value to be encoded is indeed the MPS, the offset value is increased by the percentage chance of the MPS multiplied by the range value, as determined by an $\alpha$ state. If the actual value to be decoded is the MPS, the range value in register 208 is decreased by the percentage chance of the LPS of the $\alpha$ state multiplied by the range value. In addition to a probability look-up table 212, the AC module 200 also includes look-up tables (LUT) 214 and 216. For example, LUT 214 and 216 may be 64×6 bits. All three of these look-up tables are coupled to the state index register 204 to be indexed by the state index value stored in the state index register 204. In other words, each of LUT 212, 214 and 216 can access the same table showing the contexts.

Turning first to LUT 214 and 216 (which may be referred to as "transition LUTs"), the look-up table 214 is to provide a state index update value in case the most probable symbol (MPS) value is selected in the current cycle. For example, if the current context state ($\alpha$ state) is state "2", LUT 214 outputs state "3". The look-up table 216 provides the state index update value in case the least likely bin value is selected in the current cycle. For example, if the current context state is state "2", LUT 216 outputs state "1".

Probability LUT 212 is coupled to a four-input multiplexer 220. Probability LUT 212 outputs a probability value as a function of a state index a received from state index register 204. Both probability LUT 212 and multiplexer 220 may operate together to function as a multiplier 221. Each of the inputs of the multiplexer 220 receives a respective one of a group of four outputs from the probability look-up table 212. The multiplexer 220 is coupled to the range register 208 so as to be controlled by the two least significant bits of the range value stored in the range register 208. The value of the two most significant bits (MSB) of the range value selects the degree of precision of the outputs of the probability look-up table 212, which is, in turn, employed by multiplexer 220.

Two things may occur in the multiplier 221. First LUT 212 may determine the probabilities of the LPS of a given state $\alpha$: four precise probability values—one for each of the four quadrants; these values are input into the multiplexer 220. Secondly in multiplexer 220, the two most significant bits of the range of range register 208 are used to select one of those four pre-computed quadrant values. The resulting selection at multiplexer 220 has the effect of a multiplication to generate the range of the least probable symbol. The multiplier 221 represents the value of the probability of LPS multiplied by a quadrant of the range value.

For ease of explanation this range of LPS value will be denoted as "rLPS", and the range of MPS value will be denoted by "rMPS". The sum of rLPS and rMPS will equal the range stored in the range register 208. Also for ease of discussion in FIG. 4 onwards, elements 214, 216, and 221 are all termed as part of a table lookup 405. For ease of discussion in FIG. 4 onwards, other elements of FIG. 2 are termed as part of first stage 410.

The AC module 200 also includes a decision block 218. The decision block 218 is coupled to the state index register 204 to indicate whether the state index value stored in the state index register 204 is equal to zero. If so, the decision block 218 generates a "1" value as an output. Otherwise, the decision block 218 generates a "0" value as an output. This indicates that there is a purported 50% probability of predicting the MPS. Decision block 218 may indicate a trend in the numbers and that the MPS should actually be reversed from what it is at a given point in time.

The AC module 200 also includes a subtraction block 222. The subtraction block 222 is coupled to the range register 208 and to the output of the multiplier 221. The subtraction block 222 operates to subtract the rLPS value calculated by the multiplier 221 from the range value stored in the range register 208. The result of this subtraction is a difference value indicated at 224. In other words, subtraction block 222 generates as its output the range of the MPS (rMPS), as the range of the LPS has been subtracted from the range value. Both the rMPS and the rLPS are input into multiplexer 246 to be selected at a later time, as will be discussed below.

The AC module 200 also includes an addition block 226. The addition block 226 is coupled to the offset register 206 and to the output of the subtraction block 222. The addition block 226 operates to add the difference value output from the subtraction block 222 to the current offset value stored in the offset register 206. The result of the addition performed by the addition block 226 is a sum value indicated at 228. In other words, the offset value has been added to the rMPS.

The AC module 200 also includes an AND logic gate 238. The AND gate 238 has an inverting input coupled to the output of a comparison of the output of MPS register 202 and the value of the bit being encoded. The AND gate 238 also has a non-inverting input coupled to the output of the decision block 218. Coupled to the output of the AND gate 238 is a multiplexer 240, wherein the output of the AND gate 238 may control the multiplexer 240 operation. Multiplexer 240 has two inputs, of which one is an inverting input. Both of the inputs of the multiplexer 240 are coupled to MPS register 202. The multiplexer 240 selects between the value of MPS register 202 and the inverse of the value in response to the output of the AND gate 538.

If the AND gate output is "1" (logical true), then the multiplexer 240 selects the inverse of the MPS value to be the output value of the multiplexer 240. If the AND gate output is "0" (logical false), then the multiplexer 240 selects the MPS value to be its output value. The output value from the multiplexer 240 is then stored in a MPS value update register 242. The MPS value update register 242 is part of the symbol value selection and updating logic used to change the value of MPS register 202 when coding another bit (element 201), as well as for updating the context information in the context module for the look-up table, such as LUT 182 of context adaptation module 180 shown in FIG. 1B.

The AC module 200 further includes a multiplexer 244 which is coupled to the offset register 206 and to the output of the addition block 226. The multiplexer 244 is also coupled to the output of the comparison of the output of MPS register 202 and the value of the bit being encoded. Under the control of the output of the comparator, the multiplexer 244 selects between the current offset value stored in the offset register 206 and the summation value 228 that is output from the addition block 226. If the output of the comparator is "1", the multiplexer 244 selects the current offset value to be its output value. If the output of the comparator is "0", the multiplexer 244 selects the summation value 228 to be its output value.

The AC module 200 further includes a multiplexer 246. The multiplexer 246 has an input coupled to the subtraction block 222 to receive the difference value 224. The difference value 224 is the rMPS. The other input of the multiplexer 246 is coupled to the output of the multiplexer 220, which is the rLPS. The multiplexer 246 is also coupled to the output of the comparator for MPS register 202 and the value of the bit being encoded. Under the control of the output of the comparator, the multiplexer 246 selects between the difference value 224 and the range look-up table value selected by the multiplexer 220. If the output of the comparator is "1", the multiplexer 246 selects the difference value 224 to be its output value. If the output of the comparator is "0", the multiplexer 246 selects the range look-up table value output from the multiplexer 220 to be the output value of the multiplexer 246. In other words, if the offset value is less than or equal to the rMPS, then the rMPS is conveyed as output of multiplexer 246 in order to update the offset and range values via offset update register 258 and range update register 262. If the offset value is greater than the rMPS, then the rLPS is conveyed to offset/range updating logic.

Figure 4A:
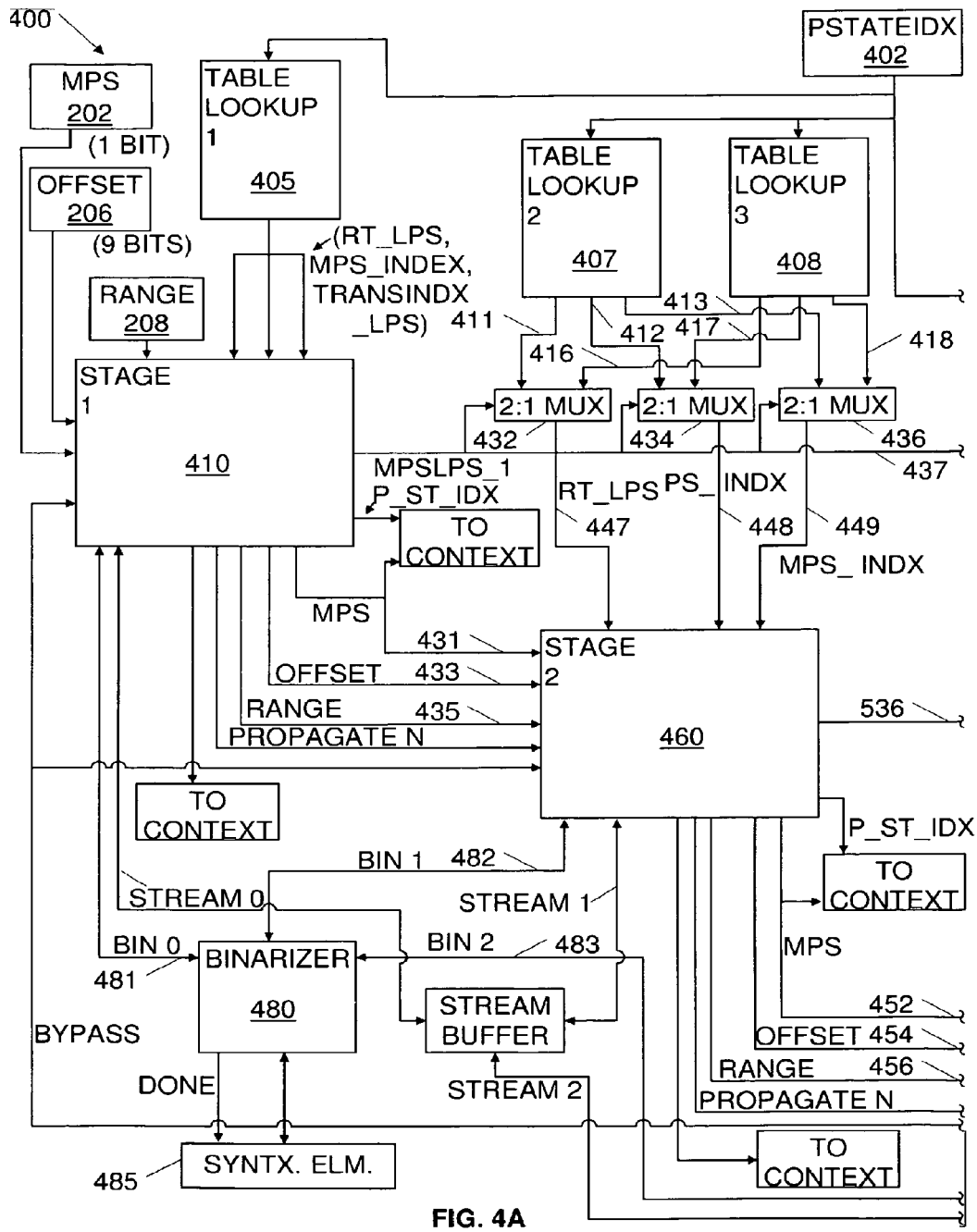
FIGS. 4A-B illustrate a parallel CABAC encoder.

It should be understood that the values input to the multiplexer 244 may be considered "offset update values" in that these values are, or may be used to produce, a value that may be the offset value for a comparison of an offset value versus a least probable range value. It should also be understood that the values input to the multiplexer 246 may be considered "range update values" in that these values are, or may be used to produce, a value that may be the range value for a comparison of an offset value versus a range value. The respective output values selected by the multiplexers 244 and 246 are both provided as inputs to offset and range updating logic as depicted in FIG. 2. In addition to providing updating functions for the range and offset values, the offset and range updating logic also serves as the source point of the bits to be encoded (compressed) into bins by the AC module 200. The range value derived in the offset/range updating logic is sent both to the context module and to second stage, as depicted in FIG. 4A. The offset value derived from the offset/range updating logic is also sent to the context module and to second stage, as also depicted in FIG. 4A.

The offset and range updating logic includes a leading zero detection (LZD) circuit 254. The LZD circuit 254 is coupled to the output of the multiplexer 246 to detect a leading zero-valued bit in the output value from the multiplexer 246. (It is to be understood that the "leading zero-valued bit" is the most significant zero-valued bit in a binary number or sequence of bits.) Further, the offset and range updating logic includes an input shift and logic operation block 256. The input shift and logic operation block 256 is coupled to the LZD circuit 254 to be controlled by the LZD circuit 254. The input shift and logic operation block 256 is also coupled to register 252 to select bits from the input bit stream. Under the control of the LZD circuit 254, the input shift and logic operation block 256 shifts out a number of bits from the input bit stream, with the number of shifted-out bits corresponding to the position of the leading zero-valued bit in the output of the multiplexer 246, as detected by the LZD circuit. As part of the same operation, the input shift and logic operation block 256 performs a logical OR operation to the shifted-out input bits and to bits in the output from the multiplexer. The resulting output from the input shift and logic operation block 256 is used to update the offset register 206 for the next operating cycle as indicated at offset update register 258.

Additionally, the offset and range updating logic includes a range shift block 260. The range shift block 260 is coupled to the LZD circuit 254 to be controlled by the LZD circuit 254. The range shift block 260 is also coupled to the output of the multiplexer 246 to receive the value output from the multiplexer 246. Under the control of the LZD circuit 254, the range shift block 260 shifts out a number of bits from the output of the multiplexer 246, with the number of shifted-out bits being the same as the number of input bits shifted out in the current cycle by the input shift and logic operation block 256. The shift block 260 may also perform a logical OR operation and may be padded with "0" bits from the right. The resulting output from the range shift block 260 is used to update the range register 208 for the next operating cycle as indicated at range update register 262. The offset and range updating logic additionally may include an initializing block 264. The initializing block 264 is coupled to the range shift block 260 to supply a sequence of "0" bits to the range shift block 260 during initialization of the AC module 200.

The offset and range updating logic is operative, under the control of the LZD circuit 254, to perform in one clock cycle a plurality of iterations of the renormalization loop called for by conventional software-based 1-1.264/CABAC encoders. The effective number of iterations of renormalization that are performed in one clock cycle is controlled by the output from the LZD circuit 254. For example, LZD logic block 270 may look for more than two leading zeros, to left shift or normalize. If the LZD logic block 270 detects more than two leading zeros and level in offset is half or higher (leading bit being 1), it may be treated as an overflow condition (element 272). If the LZD logic block 270 detects more than two leading zeros and level in offset is less than a quarter (leading 2 bits are 00), it may be treated as an underflow condition (element 274). If the LZD logic block 270 detects more than two leading zeros and level in offset is in-between (i.e. half>offset>=quarter) then it may be treated as a propagate condition (element 276), and an outstanding bit count may be incremented. For an overflow, a '1' followed by the outstanding number of '0' bits are generated into the output stream first in, first out (FIFO) 278. Alternatively, for an underflow, a '0' followed by an outstanding number of '1' bits are putout into the output stream FIFO 278.

The AC module 200 also includes a multiplexer 266. The multiplexer 266 is coupled to the look-up tables 214 and 516 to receive the values selected from them as a function of the state index value stored in the state index register 204. The multiplexer 266 is coupled to the output of the comparator for the output of MPS register 202 and the value of the bit being encoded. Under the control of the comparator, the multiplexer 266 selects between the value from the look-up table 214 and the value from the look-up table 216. If the output of the comparator is "1", the multiplexer 266 selects the value from the look-up table 214 to be the output value of the multiplexer 266. If the output of the comparator is "0", the multiplexer selects the value from the look-up table 216 to be the output value of the multiplexer 266.

For example, assuming again that the current $\alpha$ state is "3", either the next most likely context state, such as determined by an $\alpha$ state, "4", is selected from 214, or the next least likely context state, such as state "2" is selected from 216. The next least-likely context state is selected if the offset is greater than the rLPS, and the next most-likely state is selected if the offset is less than the rLPS.

The output value from the multiplexer 266 is then stored in a state index update register 268. The state index update register 268 is part of the AC module 200 and is coupled to the output of the multiplexer 266. From the state index update register 268, the state index update value is output from the AC module 200 to the context information update logic of the context module to update the look-up table. State index register 268 is also coupled to second stage, as will be described below.

The architecture of the AC module 200 as described herein may help optimize output of encoded bins in a small number of clock cycles. The efficient operation of the parallel binary arithmetic encoder is promoted by the operation of the offset and range updating logic to perform several stages of renormalization in a single cycle, and also by the parallel control of several multiplexers by a single comparator that compares the bit being encoded and the value of the MPS.

The context module and the arithmetic encoder may contain circuitry to respond to a "bypass flag". The bypass flag may appear in the input bit stream to indicate that a very low probability syntax element is being transmitted without arithmetic encoding. The bypass flag triggers a bypass mode so that, for example, the look up tables 212, 214, and 216 are not accessed and blocks 202 and 204 are idle.

Figure 3:
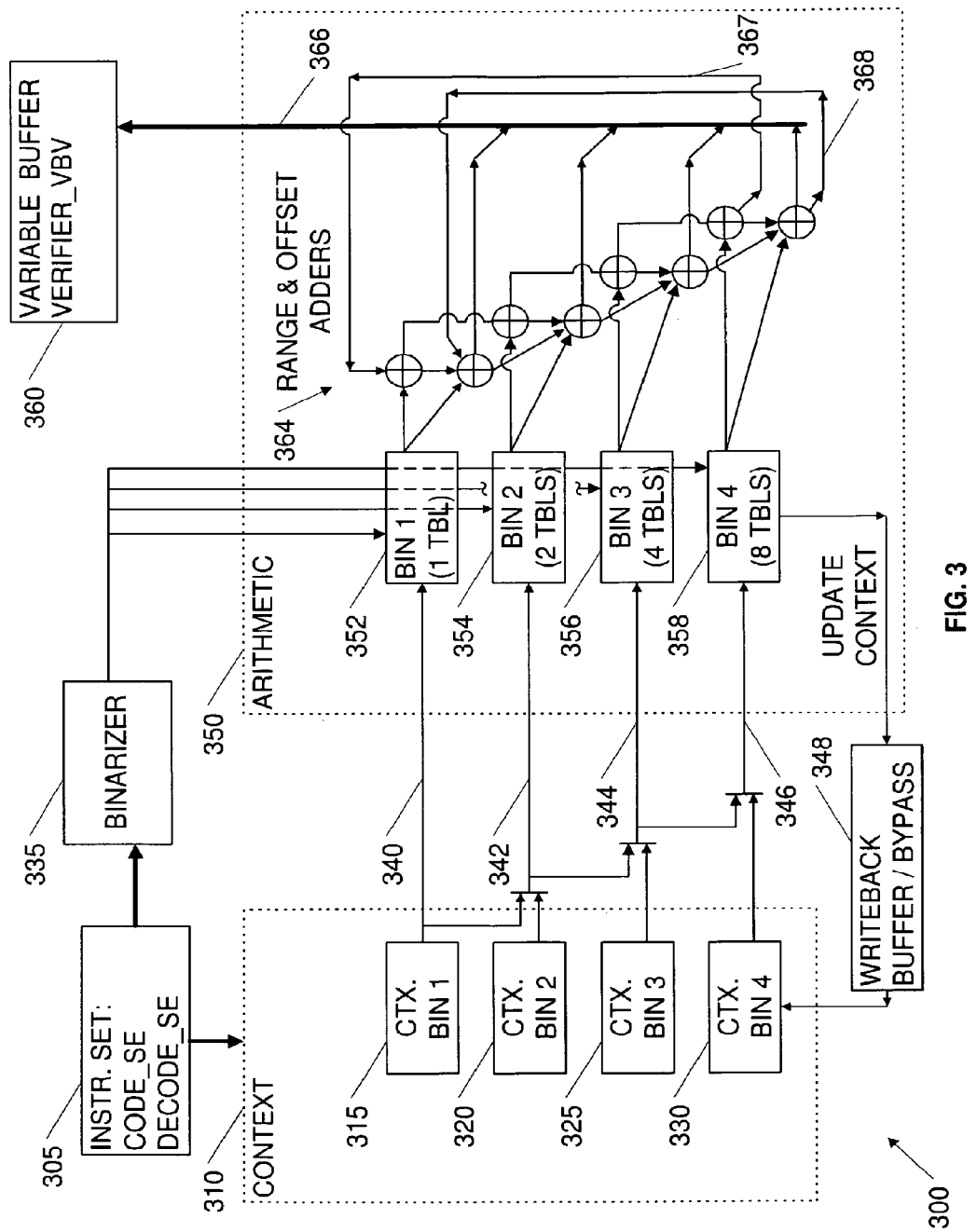
FIG. 3 illustrates a process of parallel encoding or decoding by a binarizer module, a context module, and an arithmetic codec module.

FIG. 3 illustrates a process of parallel encoding or decoding by a binarizer module 335, a context module 310, and an arithmetic codec module 350 according to one or more embodiments. More particularly, FIG. 3 depicts how an apparatus 300 may receive either an encode or a decode instruction for a syntax element 305 and simultaneously dispatch the instruction to the binarizer module 335 and the context module 310 for processing. In other words, sending an instruction for coding/decoding a syntax element to context module 310 and binarizer module 335 may select probability states and bin strings, respectively, for processing by arithmetic codec module 350.

Upon receiving the dispatched instruction, binarizer module 335 may create variable-length coded bins according to the syntax element. For example, for a given encode instruction and syntax element, binarizer module 335 may use an EGC or an EGk encoding process to create bin 352, bin 354 (with 2 transition tables), bin 356 (with 4 transition tables), and bin 358 (with 8 transition tables).

While the binarizer module 335 creates the VLC bins (352, 354, 356, and 358), context module 310 may also generate corresponding sets of probability state and MPS values for each of the bins. For example, context elements 315, 320, 325, and 330 may represent individual fields in different context tables, or fields in a row of a single context table, that allow context module 310 to generate the sets of probability state and MPS values for each of the bins 352, 354, 356, and 358, respectively.

Context element 315 may provide a one set of values 340 to arithmetic codec module 350 for the first bin 352. Context elements 315 and 320 may provide a second set of values 342 for the bin 354. Similarly, context elements 315, 320, and 325 may provide a third set of values 344 for bin 356, while context elements 315, 320, 325, and 330 may provide a fourth set of values 346 for the bin 358. In other words, within the arithmetic codec module 350 there may be fifteen (15) repeated step units to unfold three levels of a binary tree. The tree of the probability transition tables may allow the arithmetic codec module 350 to predict or accommodate the probability state and MPS values for further bins.

According to the bin strings received from binarizer module 335, as well as the pairs of offset and range values, the arithmetic codec module 350 may update the corresponding local variables via the range and offset adders 364. A better understanding of the process may be understood by referring back to the arithmetic coder module 200 of FIG. 2. In referring to FIG. 2, two bits of range register 208 are used to by the select logic of multiplexer 220. The output of multiplexer 220 is sent to both subtraction block 222 and to range shift block 260 via multiplexer 246.

Control for the shifter comes from LZD circuit 254, which detects the leading zeros, such as detecting that certain leading bits are empty, and shifts the numbers to the left. In other words, LZD circuit 254 and range shift block 260 remove the leading zeroes. For example, if we have nine bits of precision, LZD circuit 254 detects say four bits of the nine and shifts all of the other the bits to the left by four bit positions. The shift operation may be analyzed as a multiplexing operation, since it is not clocked. The result of the shift operation is transferred into range update register 262.

Now, keeping in mind the operations for the value of range register 208 being processed, with a corresponding updated range value being calculated and placed in range register 262, we can compare these operations to those of FIG. 3. The range and offset values may be considered as entering the series of adders 364 (addition and/or subtraction blocks). So the topmost adder to the right of bin 352 may correspond to the subtraction block 222 depicted in FIG. 2.

In analyzing the above process, one may see that the range value stored in range register 208 is scaled and normalized via the operation of multiplexer 220, subtraction block 222, multiplexer 246, LZD circuit 254, and range shift block 260. For example, these elements may take the range value of range register 208 and scale it by taking a fraction of it, such as 80% to 78%, by subtracting 2%. In other words, multiplexer 220 and subtraction block 222 may help perform multiplication and subtraction operations for scaling. This result, which is 78% in this example, may be used for next/subsequent bin to be processed. The normalizing of the calculated value is then normalized, by removing the leading zeroes by range shift block 260, which will enable the value to be back within an appropriate range for next bin.

A similar yet slightly different comparison may be made for the updating of the offset register 206. The two bits coming from the subtraction block 222 (difference value 224), may be added to the value of offset register 206 via addition block 226. The resulting output of multiplexer 244 may be used to update the offset value stored in offset register 206 by placing the resulting calculations in offset update register 258, after removing the leading zeroes. Referring back again to FIG. 3, the second adder to the right of bin 352 may correspond to the addition block 226 depicted in FIG. 2. In other words, each bin may be process by a different stage of the arithmetic decoder, wherein the output of one pair of adders for a single bin may be immediately sent to the subsequent stage for the subsequent bin. The result of propagating the values through the adders in a successive manner, may produce the lines 367 and 368, which may correspond to the transference or updating of the updated range and offset values in update registers 262 and 258, to range register 208 and offset register 206, respectively.

An alternate way of handling four bins in a parallel manner, would be to pick all four ranges, scale and normalize all of them, and then at the end, select only specific the branches, as appropriate. Alternatively, cascading the adders, or the addition and subtraction blocks, may allow the arithmetic codec module 350 to select the appropriate parameters, or range and offset values, for successive bins in an efficient manner. In other words, instead of performing a single scaling operation and a single normalizing operation, in four different and consecutive steps, we can generate four scales, pick the appropriate one of the four scales, and normalize only the one scale.

Arithmetic codec module 350 may perform the normalizing process, as described, to increment the propagate count until an overflow condition or an underflow condition occurs, whereupon the bits are emptied out to the video information stream via variable buffer verifier 360. In other words, variable buffer verifier 360 may correspond to the output of multiplexer 278, in FIG. 2. At the end of the processing a set of bins, the local variables may be sent back to the first stage for the next clock cycle to encode "N" additional bits, or until the context, binarizer, and arithmetic codec modules (310, 335, 350) are finished encoding the syntax element. Additionally, the process probability may be updated in the context block for future reference (element 348). For example, the writeback buffer (element 348) may correspond to the transference of the value calculated and placed into state index update register 268. That is to say, the outstanding bit count (propagate count), offset (offset/level), and range (probability window), may be updated for subsequent operations.

Figure 4B:
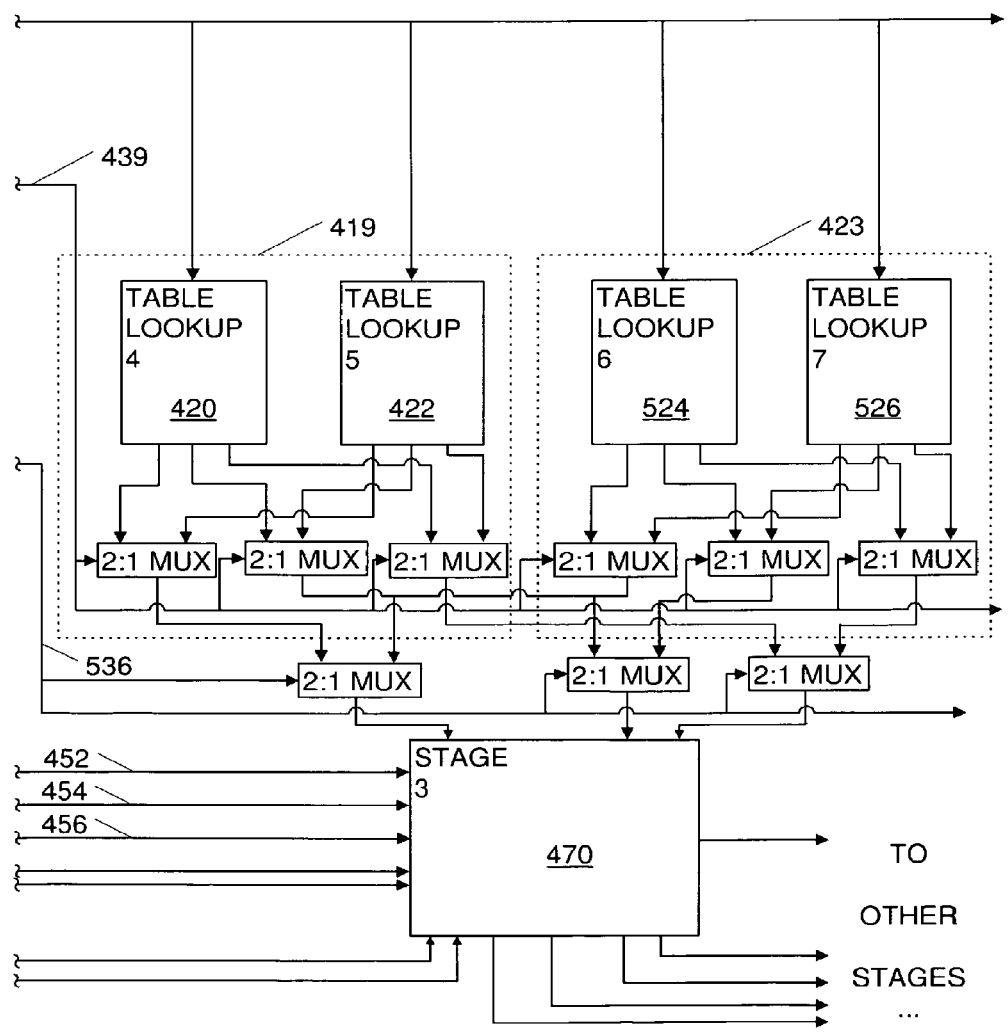

Turning now to FIG. 4A and FIG. 4B, illustrated is a parallel CABAC encoder 400 according to some embodiments. The most probable symbol (MPS) value register 202, the offset register 206, and the range register 208 are coupled into a first stage 410 of FIG. 2. Also, LUT 405 is also coupled into first stage 410, wherein LUT 405 may comprise the combination of tables 212, 214, and 216 in FIG. 2. A probability state index register 402 is also coupled to LUT 405. The output of LUT 405, which are the outputs of 216 (next 'n' least likely state), 214, (next 'n' most likely state) and an output of multiplier 221 are coupled into first stage 410. For ease of explanation, the output of an element of the present disclosure, such as LUT 514, may also be referenced as 514 as well.

Probability state index register 402 is also coupled to a LUT 407 and a LUT 408. Each of the LUTs 407 and 408 have three outputs, 411-413 and 416-418, respectively. Each of these outputs is analogous to each of the outputs for LUTs 214, 216, of multiplier 221, but for a next more or less likely state, (n+1) as will be described below. Furthermore, in some embodiments, the order of outputs may be rearranged. In some embodiments, the least likely state is the first output, the most likely state is the second output, and the range of the least likely state is the third output.

In LUT 407, for a given a state from probability state index register 402, LUT 407 receives the $\hat{\alpha}$ state received from probability state index register 402, looks at the $\hat{\alpha}+1$ state and outputs a value as a function of the $\hat{\alpha}+1$ state. For example, if the $\hat{\alpha}$ state received from the context module is "3", the $\hat{\alpha}+1$ state is "4". Therefore, a next least likely state 411, a next most likely state 412, and a range of the least likely value 413 for the $\hat{\alpha}+1$ state (i.e. state 4) is transmitted from 407 over 411-413, respectively. For example, if $\hat{\alpha}$ of probability state index register 402 $\hat{\alpha}$=3, the LUT ($\hat{\alpha}+1$) 407 value becomes $\hat{\alpha}$=4. Therefore, the MPS output $\alpha$+1 (6=5) is sent to MUX 432 over 411, the $\hat{\alpha}-1$ LPS stage ($\hat{\alpha}$=3) is sent to a MUX 434 over 412, and the range of the LPS of ($\hat{\alpha}+1$, i.e., $\hat{\alpha}$ state 4) percentage LPS (12%) is conveyed to a MUX 436 over 413.

In LUT 408, for a given $\hat{\alpha}$ state from probability state index register 402, LUT 408 looks at the $\hat{\alpha}-1$ state and sends values as a function of the $\hat{\alpha}-1$ state. For example, if $\hat{\alpha}$ state is "3", the $\hat{\alpha}-1$ state is "2". Therefore, a next least likely state 416, a next most likely state 417, and a range of the least likely value for the $\hat{\alpha}-1$ state (i.e. state 2) 418 is transmitted from 408 over 416-418, respectively. For example, if a of probability state index register 402 $\hat{\alpha}$=3, the LUT ($\hat{\alpha}-1$) 408 value becomes $\hat{\alpha}$=2. Therefore, the MPS output $\hat{\alpha}+1$ ($\hat{\alpha}$=3) is output to MUX 432 over 416, the $\hat{\alpha}-1$ LPS stage ($\alpha$6=3) is output to a MUX 432 over 417, and the range of the LPS of ($\hat{\alpha}-1$, i.e., $\hat{\alpha}$ state 2) percentage LPS (30%) is conveyed to MUX 436.

Each of MUX 432 (representing a choice between MPSs for the $\hat{\alpha}+1$ and the $\hat{\alpha}-1$ states), MUX 434 (representing a choice between different LPS for the $\hat{\alpha}+1$ and the $\hat{\alpha}-1$ states), and MUX 436 (representing a choice between different percentages for the $\hat{\alpha}+1$ and the $\hat{\alpha}-1$ states) is controlled as a function of output 437 from first stage 410, and these values, the selected rLPS for the next highest context state, or the selected rLPS for the next lowest context state, are then conveyed to a second stage 460.

For second stage 460, instead of receiving 202, 204, 206, 208, etc. from probability state index register 402, the MPS value, the offset (i.e., the tag), and the range are received from first stage 410 as MPS 431, offset 433 and range 435. Also, the overflow/underflow/propagate signals (272, 274, and 276) of first stage 410 may be used by second stage 460. In MUXes 432, 434, and 436, either the LUT ($\hat{\alpha}+1$) 407 outputs are selected, or the LUT ($\hat{\alpha}-1$) 408 outputs are selected, as a function of the output 437 of first stage. LUT ($\hat{\alpha}+1$) 407 is selected if output 437 is "1", and LUT ($\hat{\alpha}-1$) 408 is selected if output 437 is "0". Thus the appropriate state for second stage 460 is selected based on the current bin value output by first stage 410. Then, whichever output (i.e., of 407 or 408) is selected, this selected output is then conveyed as range LPS (n+1), the most likely $\hat{\alpha}$ state for (n+1) and the least likely $\hat{\alpha}$ state for (n+1).

In second stage 460, inputs 416 and 449 are received as a function of output 437. These represent the next least likely transition, (449) the next most likely transition (448), for either the ($\hat{\alpha}-1$) state or the ($\hat{\alpha}+1$), and the range of the least likely range (447) of either the ($\hat{\alpha}+1$) state as selected by output 437. Furthermore, updated state index 435 is also conveyed to second stage 460. Then, processing occurs in second stage 460 that generates a second output 536, which is conveyed to third stage 470.

When encoding in parallel, a binarizer 480 receives a syntax element 485 and uses it to generate a plurality of bins, such as bin 481, bin 482, and bin 483, which are transmitted to first stage 410, second stage 460, and third stage 470, respectively. Worth noting, the binarizer 480 generates the bins from the syntax element and transfers then to the various stages during an encoding operation. During a decoding operation, the converse would be true. For example, each of the stages would generate a different bin and send it to binarizer 480, for which binarizer 480 would use to construct a syntax element.

Second stage 460 also generates an MPS (n+2) 452, an offset (n+2) 454, a range (n+2) 456, and the various overflow/underflow/propagate signals, and sends them to third stage 470. Similar to the manner that output 437 from first stage 410 controls MUXes 432, 434, and 436, for second stage 460, output 536 from second stage 460 also controls the three MUXes delivering the different values from look up tables 420, 422, 524, and 526, which are in turn coupled to third stage 470.

Probability state index register 402 is also coupled to LUT 420, LUT 422, LUT 524, and LUT 526. For ease of explanation, LUT 420, a LUT 422 are designated as belonging to first group 419, and LUT 824, and LUT 526 are designated as belonging to a second group 423. Each of the tables 420, 422, 524, and 526 has three outputs. Additionally, each of the tables 420, 422, 524, and 526 may also have substantially the same structure as the LUTs 405, 407, and 408 in that each includes a respective "most likely" LUT, a respective "least likely" LUT, and a respective range/probability LUT. Even further, similar to first stage 410 generating outputs for second stage 460 and third stage 470, and second stage 460 generating outputs for third stage 460, third stage 460 may also generate outputs for additional stages that may be appended in a more complex encoder design, more complex than encoder 400. For example, the outputs exiting the lower right portion of third stage 470 may be connected to a fourth stage, a fifth stage, a sixth stage, etc., in a manner to the way that the outputs from stages 410 and 460 were distributed to the subsequent stages. Generally, in the parallel CABAC encoder 400, in some embodiments, use of the $\acute{\alpha}+1$ and the $\acute{\alpha}-1$ may allow for substantially parallel processing and encoding of the offset, range, a state, MSB, and so on for multiple bins or symbols. Such parallel processing and encoding may offer performance benefits. For example, in an embodiment employing four different stages, the embodiment may encode four bins or four symbols in a single clock cycle. Encode four bins or four symbols in a single clock cycle may offer better performance than, say, an embodiment that processes the bins in a serial fashion, where it may take four clock cycles to encode the four bins.

A single context module has been shown herein, to provide context information for the several binary arithmetic encoder stages. In other embodiments, two or more context modules may be provided so that not every binary arithmetic encoder stage is serviced by the same context module. Also, as used herein and in the appended claims, the "inverse" of a binary value is the other binary value; that is, "1" is the inverse of "0" and "0" is the inverse of "1".

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

Another embodiment of the invention may be implemented as a program product, such as firmware, for use with a computing device or platform to perform CABAC parallel encoding and/or decoding of a stream of video information, which may be similar to one of the systems of FIG. 1A or the apparatus of FIG. 1B. The program(s) of the program product may define functions of the embodiments (including the methods described herein) and can be contained on a variety of data and/or signal-bearing media. Illustrative data and/or signal-bearing media include, but are not limited to: (i) information permanently stored on non-writable storage media (e.g., read-only memory devices within a computer, such as on a platform motherboard); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such data and/or signal-bearing media, when carrying computer-readable instructions that direct the functions of the present invention, represent embodiments of the present invention.

The routines executed to implement the embodiments of the invention, may be part of a component, module, object, or sequence of instructions. The computer program of the present invention typically is comprised of a multitude of instructions that will be translated by a computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus an embodiment should not be limited to use solely in any specific application identified and/or implied by such nomenclature.

Figure 5:
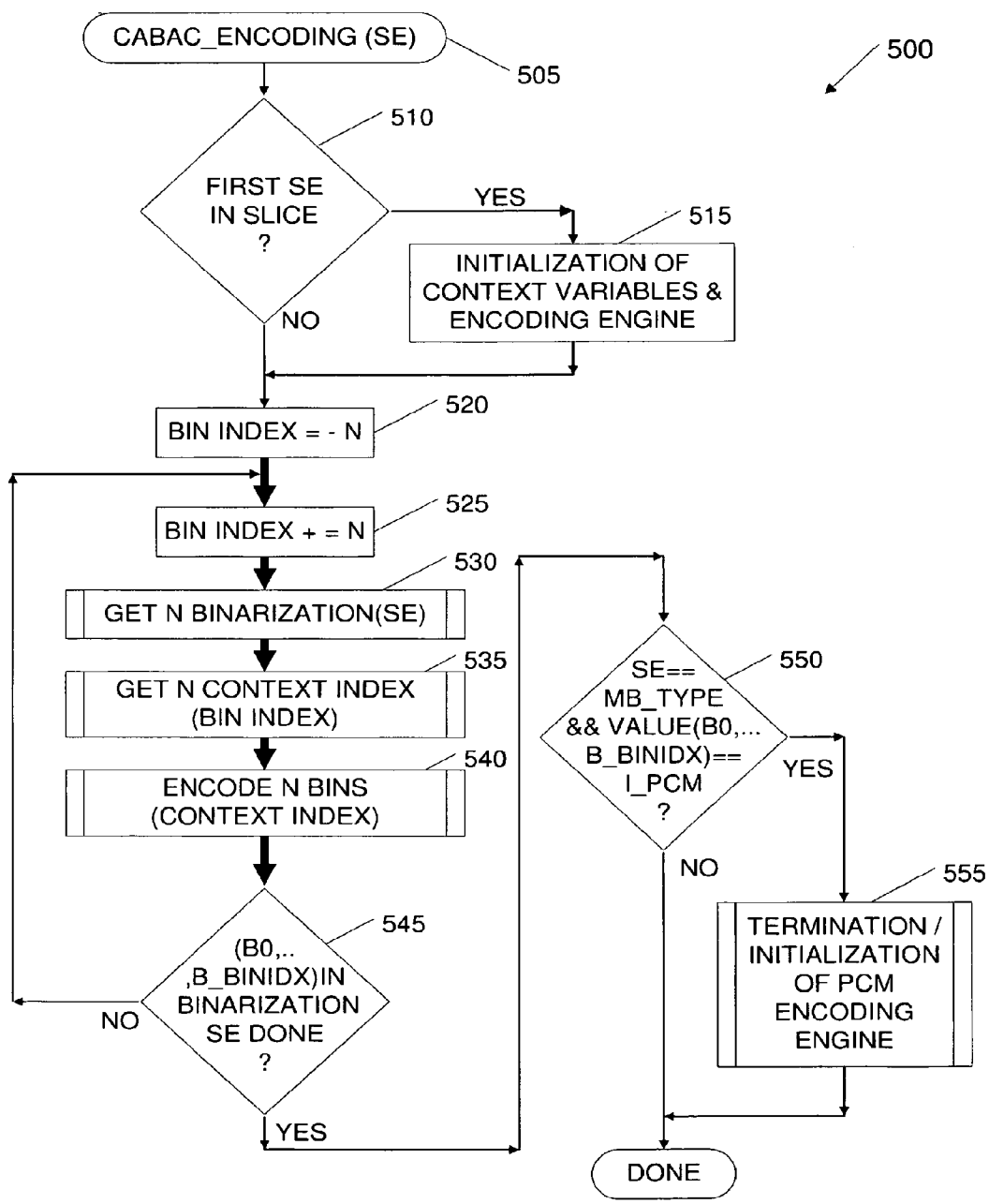
FIG. 5 illustrates a method, which may be implemented by way of software, to perform parallel encoding and/or decoding of a stream of video information.

FIG. 5 depicts a flowchart 500 that illustrates a method, which may be implemented by way of a program product such as software or firmware, to perform parallel encoding and/or decoding of a stream of video information for a system or a device. For example, the method may be executed by state-machine hardware, firmware, or software in an application-specific integrated circuit (ASIC) chip of an H.264/CABAC embedded device that performs video encoding and/or decoding, such as one or more high definition video processing devices. Flowchart 500 begins with receiving an encoding instruction for a syntax element (element 505), determining whether the syntax element is the first syntax element in the slice of video (element 510), and, if it is the first syntax element, initializing the context variables and encoding engine (element 515). For example, an HD-DVD recorder may receive a signal transmitted over-the-air, take a portion or slice of the video information, and initialize a process for the internal hardware, such as initializing context tables of the encoder, to start encoding the video information so that the encoded information may be stored on an HD disc.

A method according to flowchart 500 may continue by setting a bin index variable to an initial value (element 520) and incrementing the bin index variable (element 525). For example, the encoder of the HD-DVD may initialize the bin index variable to zero and increment it to a value of one, so that the codec may start processing a first bin element, which may be bits or bins (fractional bits), depending on whether the operation is a coding or decoding operation.

A method according to flowchart 500 may continue by getting or selecting the binarization element for the appropriate syntax element (element 530). For example, a binarizer module may create one or more variable-length coded bin elements and send them to the arithmetic codec module. Additionally, the context module may also generate or select the context index information corresponding to the VLC bin elements of the binarizer module (element 535). For example, the context module may generate corresponding sets of probability state and MPS values for the "N" number of bins.

A method according to flowchart 500 may continue by encoding a number of bins based on the values provided by the binarization module and the context module (element 540). For example, an arithmetic codec module like arithmetic codec module 350 may process four bins out of a set of eight bins for a syntax element. Upon encoding the four bins, the method may continue by determining whether all of the bins for the syntax element have been processed (element 545). Since only four of the eight, in our example to this point, have been processed, the method would continue by iteratively returning to increment the bin index (element 525) and selecting the binarization and context index elements (elements 530 and 535), etc.

A method according to flowchart 500 may then continue by determining whether to switch over to a pulse-code modulated (PCM) process for backward compatibility (element 550). If a switch to a PCM process is needed, the method may then terminate the CABAC encoding process and initialize the PCM encoding engine (element 555).

It will be apparent to those skilled in the art having the benefit of this disclosure that the present invention contemplates apparatuses, systems, and computer program products that enable parallel encoding and/or decoding of video information. It is understood that the form of the invention shown and described in the detailed description and the drawings are to be taken merely as examples. It is intended that the following claims be interpreted broadly to embrace all the variations of the embodiments disclosed.

Although the present invention and some of its aspects have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope of the attached claims will achieve every objective. Moreover, the scope of the present application is not intended to be limited to the particular embodiments of the process, machine, manufacture, composition of matter, means, or methods described in the specification. As one of ordinary skill in the art will readily appreciate from the disclosure of the present invention, processes, machines, manufacture, compositions of matter, means, or methods presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, or methods.

What is claimed is:

1. An apparatus, comprising:
one or more processors to encode a video stream via an encoder, wherein the encoder comprises:
a binarizer to create a plurality of bins for a syntax element for information of the video stream;
a context adapter to generate an index value and a most probable symbol (MPS) value for each of the plurality of bins in parallel and convert between bins and bits with a bin-to-bit ratio of greater than one; and
an arithmetic coder to encode the plurality of bins from the binarizer via the generated index value and MPS value in parallel with the context adapter processing the plurality of bins from the binarizer.

2. The apparatus of claim 1, wherein the apparatus is arranged to decode the plurality of bins via selections of probability values based on the index values and the MPS value.

3. The apparatus of claim 1, wherein the binarizer is arranged to create at least one bin of the plurality of bins via an exponential Golomb code (EGC).

4. The apparatus of claim 1, wherein the binarizer is arranged to create a plurality of variable-length coded (VLC) bins for the syntax element.

5. The apparatus of claim 1, wherein the context adapter comprises at least one look-up table (LUT) to generate the index value and the MPS value.

6. The apparatus of claim 1, wherein the arithmetic coder comprises a plurality of arithmetic coding engines, one of the plurality of arithmetic coding engines to process one bin of the plurality of bins while a second arithmetic coding engine processes a second bin of the plurality of bins.

7. The apparatus of claim 1, wherein the arithmetic coder comprises fifteen look-up tables to generate most probable symbol values and least probable symbol values to encode the plurality of bins, wherein further the plurality of bins comprises four bins.

8. The apparatus of claim 1, wherein the arithmetic coder is arranged to update offset and range values upon encoding the plurality of bins, wherein the updated offset and range values are to be used to encode a subsequent plurality of bins.

9. A computer program product comprising a non-transitory computer usable medium having computer usable program code for encoding video information, the computer program product including:
computer usable program code to implement a binarizer for selecting a plurality of bins for a syntax element of the video information;
computer usable program code to implement a context adapter for selecting a probability symbol value and a probability index value for each of the plurality of bins in parallel and for converting between bins and bits with a bin-to-bit ratio of greater than one; and
computer usable program code to implement an arithmetic coder for encoding the plurality of bins from the binarizer via the probability symbol value and the probability index value in parallel with the context adapter processing the plurality of bins from the binarizer.

10. The computer program product of claim 9, further comprising computer usable program code for receiving an instruction to select the plurality of bins, the probability symbol, and the probability index value.

11. The computer program product of claim 9, further comprising computer usable program code for updating a range value and updating an offset value, wherein the range value and offset value are used in conjunction with the probability symbol value to select the plurality of probability values.

12. The computer program product of claim 11, further comprising computer usable program code for scaling and normalizing the range and offset values to generate the updated range value and the updated offset value.

13. The computer program product of claim 9, wherein the computer usable program code for selecting a plurality of bins comprises computer usable program code for creating a plurality of variable-length coded bins via at least one of an exponential Golomb code (EGC), a unary code, a variation of and EGC, and a variation of a unary code.

14. The computer program product of claim 9, wherein the computer usable program code for selecting the plurality of probability values which correspond to the plurality of bins comprises computer usable program code for selecting probability values from sixty-three (63) look-up tables, wherein further the 63 tables correspond to six stages of encoding to process six bins in a single encoding iteration.

15. The computer program product of claim 9, wherein the computer usable program code for encoding the plurality of bins in parallel comprises computer usable program code for detecting underflow and overflow conditions to determine a propagate condition and increment an outstanding bit count.

* * * * *